(12) United States Patent
Adkisson et al.

(10) Patent No.: US 6,653,710 B2
(45) Date of Patent: Nov. 25, 2003

(54) FUSE STRUCTURE WITH THERMAL AND CRACK-STOP PROTECTION

(75) Inventors: James W. Adkisson, Jericho, VT (US); Edward Maciejewski, Wappingers Falls, NY (US); Peter Smeys, White Plains, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 09/788,077

(22) Filed: Feb. 16, 2001

(65) Prior Publication Data

US 2002/0113291 A1 Aug. 22, 2002

(51) Int. Cl.[7] ............................................. H01L 29/00

(52) U.S. Cl. ....................................... 257/529; 257/530

(58) Field of Search ................................. 257/529, 530

(56) References Cited

U.S. PATENT DOCUMENTS

| | | | |
|---|---|---|---|
| 5,095,297 A | 3/1992 | Perreault et al. | |
| 5,538,924 A | 7/1996 | Chen | |
| 5,851,903 A | 12/1998 | Stamper | |
| 6,451,681 B1 * | 9/2002 | Greer | 438/601 |
| 2002/0086462 A1 * | 7/2002 | Kothandaraman et al. | 438/132 |

* cited by examiner

Primary Examiner—Amir Zarabian
Assistant Examiner—Kiesha Rose
(74) Attorney, Agent, or Firm—Whitham, Curtis & Christofferson, P.C.; William D. Sabo

(57) ABSTRACT

Thermal degradation of a low-k organic dielectric material is avoided or limited in the proximity of a heat source such as a fusible element by overlaying the low-k material with a thermally conductive material and providing a low thermal resistance path from the thermally conductive material, possibly having a low modulus of elasticity, to a heat sink. The thermally conductive material thus provides crack-stop protection for further layers of an integrated circuit or interconnect structure above the fusible element by mechanical, chemical and thermal encapsulation of the heat source and low-k material.

16 Claims, 4 Drawing Sheets

FUSE STRUCTURE WITH THERMAL AND CRACK-STOP PROTECTION

BACKGROUND OF THE INVENTION

1. Field of the Invention

The present invention generally relates to semiconductor integrated circuits and other connection arrangements which include fuses for programming thereof and, more particularly, to high density circuit structures utilizing low dielectric constant materials.

2. Description of the Prior Art

It has long been recognized that increased density of circuit formation in integrated circuits and interconnect structures such as printed circuit boards yields potential increases in performance and functionality as well as manufacturing economy. However, increased density is generally accompanied by increased proximity of current-carrying structures which can compromise performance by increasing capacitance and capacitive coupling of such structures.

Therefore, there has been substantial recent interest in insulators having particularly low dielectric constants for use between conductors in order to reduce capacitance and capacitive coupling. These materials often present additional problems of strength and/or thermal stability which may also compromise manufacturing yield and, hence, manufacturing economy, as well as some potential problems of long-term reliability.

For example, an organic polymer insulator known as "SiLK" (for silicon low-k; a misnomer since it contains carbon but no silicon), commercially available from Dow Chemical Co., exhibits a suitably low dielectric constant and is easily applied in liquid form by well-known spin-on techniques and cured at a temperature of about 400° C. However, this material will pass through a glass transition at roughly 450° C., causing changes in stress. This stress could cause damage in adjacent electrically active layers or cause delamination of the SiLK layer. If any of these processes degrade the structure or allow cracks to develop in barrier layers, the chip may fail during use.

The SiLK layers are also poor barriers to oxygen diffusion, and if oxygen reaches metal conductor layers such as copper metallization, corrosion can result; compromising electrical integrity or at least increasing resistance (and propagation time) of the affected conductors. Since SiLK is a relatively viscous film, cracks in the SiLK may or may not propagate, and such cracks are likely to terminate at the edge of a harder layer such as the nitride barriers. Degradation is more likely to occur because of a catastrophic event at high temperature rather than a crack propagation event.

It is also customary at the present time to provide fuses or antifuses in integrated circuit devices and other connection arrangements. Such devices may be used, for example, to alter the function of the overall circuit or portions thereof or to substitute redundant circuits for others having defects or reduced operating margins in order to enhance manufacturing yield. Localized heating of metal fuses using lasers at higher levels of material have typically been used in the past, but more recently, silicide materials such as cobalt silicide have been favored due to improved scaling capability, compatibility with standard processing and ability to maintain an oxygen and water diffusion barrier.

An exemplary silicide fuse is disclosed in U.S. Pat. No. 5,708,291 which is hereby fully incorporated by reference. Passing a large current per unit cross-sectional area causes a temperature rise in the silicide, allowing the silicide to degrade through electro-migration, silicide agglomeration or catastrophic failure. This causes the bulk resistance to rise sufficiently (e.g. about ten fold) for the state of the fuse to be readily distinguished.

For example, in integrated circuits at the present state of the art, a fuse can be fabricated of a silicide film conductor which is (or may be shaped to be, as disclosed in U.S. Pat. No. 5,882,998, also fully incorporated by reference) about 80 nm wide and 30 nm thick in the fuse region. Thus, a current on the order of milliamperes results in a current density on the order of 50 MegAmperes/cm$^2$. Therefore, while the silicide has a relatively low initial bulk resistance, although somewhat higher than metal, substantial heating and large temperature rise will be caused in the course of programming of a fuse.

In general, an oxide and/or nitride dielectric will be employed immediately adjacent to the fuse material but usually in a relatively thin film. Thus, if a low-k dielectric is employed, it will be overlaid on that relatively thin film and thus be in very close proximity to the fuse element. Moreover, low-k dielectrics and SiLK in particular have very low thermal conductivity and can thus prevent or reduce heat transfer by which temperature rise can be limited. Therefore, low-k organic materials proximate to a fuse will be sensitive to degradation during fuse programming. Since a fuse element may be used to provide redundancy in an integrated circuit to enhance manufacturing yield, many thousands of fuses may be provided and programmed after testing. Since a 1% yield failure is very significant, a 0.1% fuse reliability failure would be intolerable since such a rate would correspond to one or more instances on every chip where redundant circuits could not be substituted, if needed.

One approach to thermally protecting an inorganic layer is disclosed in U.S. Pat. No. 5,389,814 to Srikrishnan which is assigned to the assignee of the present invention and fully incorporated by reference. In accordance therewith, the oxide insulator layer placed over the fuse element has a thickness of at least (C)×(fuse thickness)×(specific heat ratio of fuse to heat shield (e.g. oxide) material, where C is the ratio of the fuse melting/degradation temperature to the degradation temperature of the organic low k insulator material and generally has a value of roughly 5. This relationship generally leads to an insulating heat shield thickness of greater than 100 nm which may be suitable for some printed circuit board applications, as disclosed therein. However, such a thickness is larger than desired for semiconductor processing when manufacturing tolerances are considered.

It should also be understood that putting fuses at a higher level in an integrated circuit causes increased likelihood that oxygen will enter from the chip surface to reach the fuse. Additionally, the processing sequence generally makes placement of fuses at lower levels preferable. For example, placement of fuses at higher levels requires additional masking layers. Therefore, it is desirable to put fuses at the lowest level possible. However, such placement is not generally consistent with thicker heat shields.

Evaluation of fuses created with such a silicide fuse show various sorts of degradation with occasional cracking of the hard dielectric adjacent to the fuse structure. Such a crack must not be allowed to propagate to higher levels, particularly copper levels where electrical integrity is important. However, no structure suitable for placement adjacent a fuse element that provides a location for termination of cracks has heretofore been known.

SUMMARY OF THE INVENTION

It is therefore an object of the present invention to provide a structure suitable for use at any level in an integrated circuit having high integration density and including low-k dielectric materials which provides a heat shield and crack stop protection and limits temperature rise during fuse programming by efficient heat sinking.

It is another object of the present invention to provide a fuse structure that can be fabricated at very small size and including a silicide fuse element that can be fabricated near the substrate in, for example, an integrated circuit and thus exploit the heat conduction properties of the substrate to limit temperature rise and damage and to enhance device reliability.

It is a further object of the invention to provide a structurally robust integrated circuit and/or interconnect structure including fuse elements and having decreased signal propagation time and noise immunity by virtue of decreased capacitive coupling between conductors that may be very closely spaced and shielding as well as improved heat dissipation and heat control.

In order to accomplish these and other objects of the invention, an electronic device is provided including a heat producing element such as a fuse, a layer of dielectric material overlying the heat producing element, a layer of low-k dielectric material overlying the layer of dielectric material, and a layer of thermally conductive material interposed between the dielectric material and the low-k dielectric material to provide a heat shield for the low-k dielectric material.

BRIEF DESCRIPTION OF THE DRAWINGS

The foregoing and other objects, aspects and advantages will be better understood from the following detailed description of a preferred embodiment of the invention with reference to the drawings, in which:

FIG. 5 shows the use of a second mask to define an improved crack stop structure causing termination of any cracking in the least active structure with the addition of a mask and FIG. 6 demonstrates the use of a capping layer on the fuse to allow simplified use of the crack stop structure using merged connections (MCs).

DETAILED DESCRIPTION OF A PREFERRED EMBODIMENT OF THE INVENTION

Figure 1:
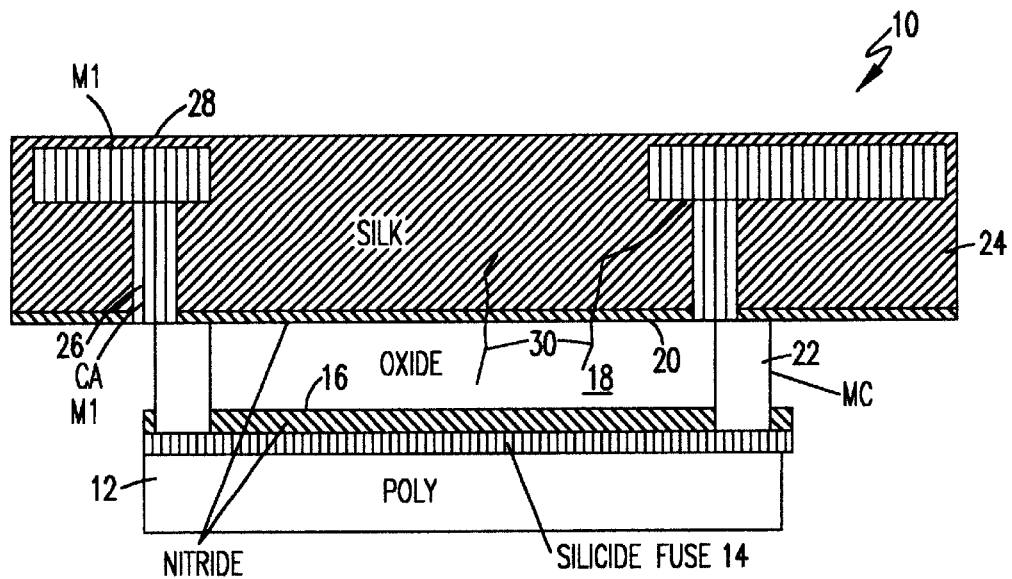
FIG. 1 is a cross-sectional view of a fuse element useful in understanding the problems addressed by the invention.

Referring now to the drawings, and more particularly to FIG. 1, there is shown, in cross-section, a fuse structure having a silicide fuse element exemplary of those in which cracking has been observed to occur. It is to be understood that while FIG. 1 does not include a structure in accordance with the invention, SiLK is shown as an exemplary low-k organic dielectric and thus is illustrative of how such a material would ordinarily be employed but for the problems noted above which are addressed by the present invention. Accordingly, no portion of FIG. 1 is admitted to be prior art with respect to the present invention. It should also be understood that the principles of the invention are applicable to other low-k organic dielectric materials other that SiLK; in regard to which the invention will be explained, below. SiLK, however, is the preferred environment and application of the invention in view of the particularly low dielectric constant, k, provided and the low temperature at which onset of degradation has been observed.

In FIG. 1 (and FIG. 2), the lowest layer of fuse structure 10 (or 100) is depicted as polysilicon. However, the nature of this material is substantially irrelevant to the practice of the invention or any other silicide fuse structure except to the extent that a portion of the layer may be consumed in the formation of silicide layer 14 which could be accomplished with a monocrystalline epitaxial layer or substrate or a silicon-on-insulator (SOI) structure. Rather, the depiction of polysilicon layer 12 is intended to convey that the fuse structure could, potentially, be placed at any location or layer in the device (e.g. integrated circuit or interconnect arrangement).

Silicide layer 14 is formed and patterned by any known technique such as deposition of silicide or metal followed by heat treatment and separated into separate fuse elements, possibly including connections, by suitable masking and lithography. The silicide is then covered by a deposited or otherwise developed nitride barrier layer 16 and an oxide layer 18 followed by a further nitride barrier layer 20. The barrier layers are intended to block mobile ions or metallics from the upper levels of metallization from entering the silicon layer and degrading the devices. This nitride layer is not required for the proper operation of the proposed fuse structure. At some point before, during or after the formation of layers 16, 18 and 20, merged connections (MC) 22 in the form of local interconnects and/or vias are formed.

A low-k organic (e.g. SiLK) insulator layer 24 is formed over barrier layer 20 and curing of the low-k material is then performed. A spin-on process is preferred since such processes provide good control over layer thickness with minimal process complexity, as is well-recognized by those skilled in the art. A relatively thick layer is preferred since capacitance and capacitive coupling are reduced with increased separation of conductors and reduction of dielectric constant of intervening material. Connections through the dielectric 26 and interconnect metallization 28 (e.g. M1) are then provided by any suitable process (e.g. Damascene, as illustrated).

Since SiLK and most other low-k organic materials are poor thermal conductors, as alluded to above, a large source of heat, represented, in this case, by silicide fuse element 14, separated therefrom by only a thin oxide or other insulator layer 18 will enhance the temperature excursion in the insulator layer 18 and portions of the SiLK layer adjacent thereto. The programming of a fuse may thus raise the temperature of the SiLK material well above the temperature at which degradation of the material will take place. There will also be a substantial generation of shear and tensile forces during the temperature excursion due to a differential of coefficient of thermal expansion. Some persistent shear and tensile forces will be developed which cannot be relieved from dimensional changes of the SiLK incident to thermal degradation. SiLK films can delaminate under stress, and cracks can be developed and propagated which can pierce barrier layer 20.

Thus, cracks 30 can be developed and propagated which may pierce barrier layer 20 and may reach contacts 26, 28 or otherwise allow diffusion of oxygen thereto, causing corrosion. It should be noted that the thickness of oxide layer 18 is nominally 300 nm which is at least marginally within the Srikrishnan criterion alluded to above in the discussion of the above incorporated U.S. Pat. No. 5,389,814. The worst design case for a high density integrated circuit, however, is a total thickness of layers 16, 18 and 20 of only 100 nm which is far outside the Srikrishnan criterion/range.

Figure 2:
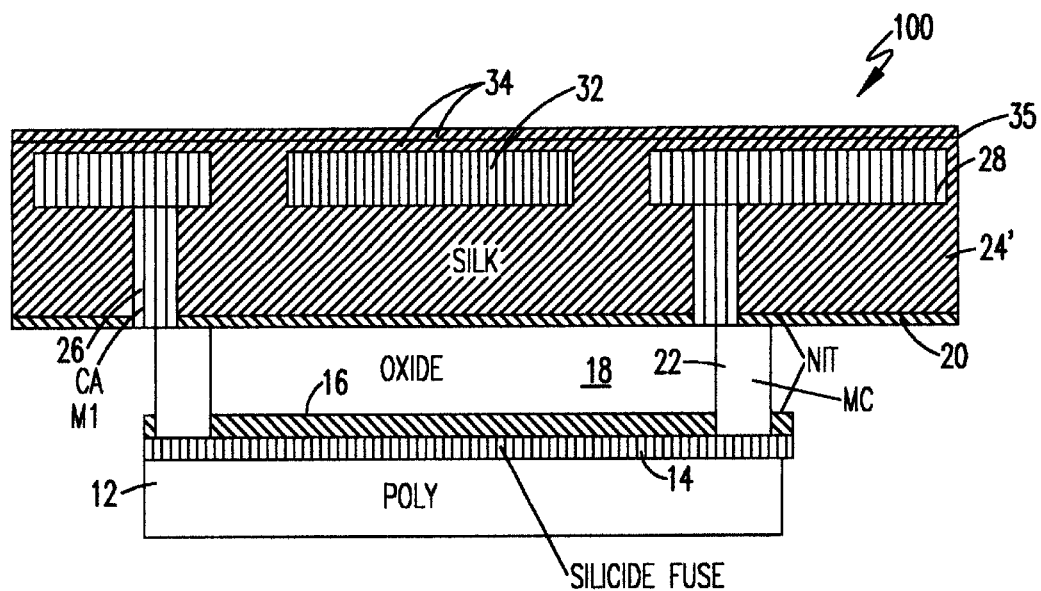
FIG. 2 is a cross-sectional view of a simplified exemplary fuse structure including the present invention.

Referring now to FIG. 2, the crack-stop and thermal protection provided in accordance with the invention will now be described. Much of the structure of FIG. 2 and the method or its formation has been discussed above in connection with FIG. 1 and thus need not be repeated. Common reference numerals are also used for structure appearing in both Figures. It will be appreciated from a comparison of FIGS. 1 and 2 that the invention essentially provides a SiLK layer 34 and a blocking layer 35, preferably of silicon nitride, encapsulating a preferably metal region 32 of high thermal conductivity above the region of the fuse. The thickness (e.g. 24') of these layers is immaterial to the practice of the invention. (It is possible that a low modulus of elasticity of metal region 32 could enhance performance of the invention but such a property is not necessary to the successful practice of the invention.)

Figure 3:
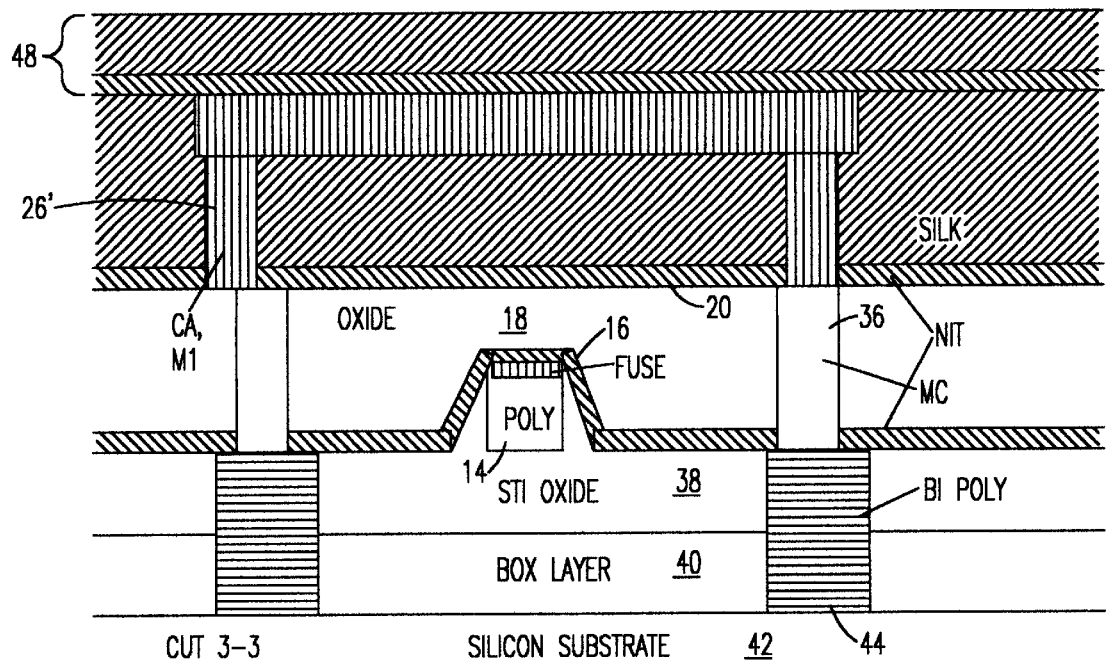
FIGS. 3 and 4 are cross-sectional (orthogonal to the section of FIG. 2) and plan views, respectively of a preferred embodiment of the invention.
Figure 4:
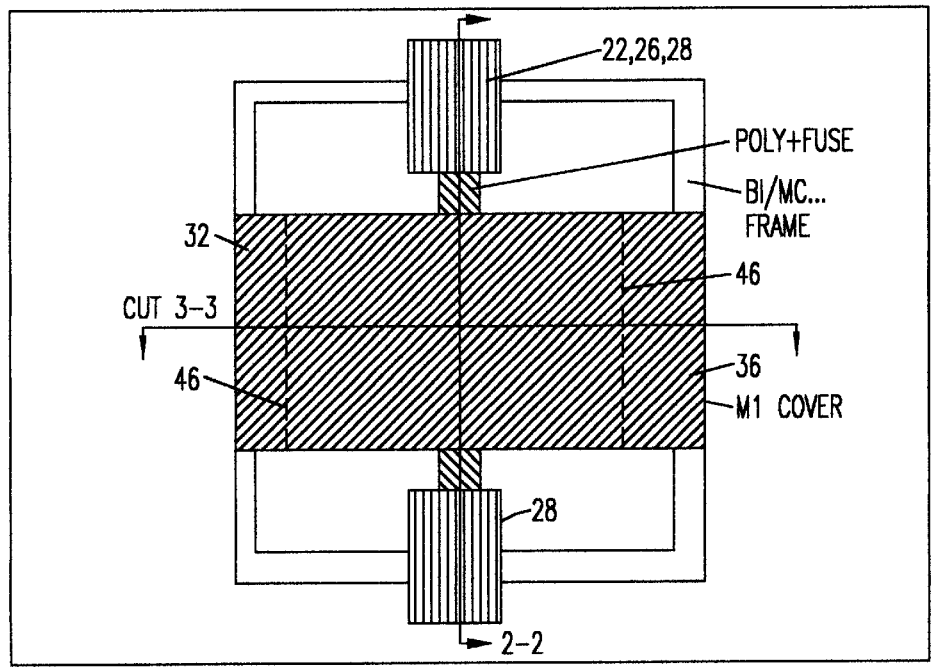

The invention also preferably provides for a thermal path 26' (which is illustrated in FIGS. 3 and 4 but exists in front of and/or behind the plane of the page of FIG. 2) to metal region 32 as well as thermal path 44 to a suitably efficient heat sink or thermal mass (e.g. silicon substrate 42). Metal regions 32 can be formed concurrently with patterning of M1 (or other layer) conductors 28 whether or not a Damascene process is used. Multiple ways of forming the metal region 32 are possible. First, a tungsten layer could be formed within the oxide layer 18 completely isolating the SiLK region from the effects of the fusing process. However, this requires a mask layer to form wires that do not contact the gate layer. This can be done either with a mask to form troughs within the oxide before or after the formation of the MC layer (FIG. 5) or by providing a dielectric on top of the fusing layer that will not be etched in the MC etch process (FIG. 6). Alternatively, the CA process can be modified to form wires as well as holes which would move layer 32 down from the top of the SiLK to the bottom. This has the same improved thermal isolation properties but the disadvantage of piercing the barrier layer and probably precluding the use of Cu to avoid copper-contamination of the devices. Further thermal paths can be provided in the same process (e.g. a first stage of a dual Damascene process; the second stage placing metal over the fuse) as is used for the formation of the merged conductors (MC) 22. Further SiLK of other low-k material can be easily applied with an additional spin-on process or other process appropriate to the material which is thus the only additional process required for the practice of the invention and provides the further advantage of substantial planarization of the surface for formation of additional layers.

Without wishing to be held to any particular theory of operation of the invention, the metal region 32 together with a thermal path 36 (FIG. 3) to a heat sink provides a substantially reduced thermal excursion at its lower surface as well as increased thermal mass that further limits the thermal excursion of the region 24. Thus, for a given thermal excursion of the fuse element, a higher thermal gradient can be achieved across the lower portion 24 of the SiLK material; thus limiting the portion thereof which can be thermally degraded by high temperature.

SiLK region 24 is thus essentially shielded from high temperatures and does not thermally degrade. At the same time, region 32 provides some relief of shear and tensile stresses whether transient or persistent and serves as a mechanical crack-stop at the M1 level preventing compromise of further layers by cracking. Further, when the device is in service, the remaining thermal shields and paths provide an efficient heat sink and thermal control for the device, as will be apparent from the following discussion of FIG. 3.

The cross-sectional view 3—3 of FIG. 3 is orthogonal to the section 2—2 of FIG. 2. Underlying layers are also illustrated as a shallow trench isolation (STI) structure 38 on which polysilicon 14 and silicide fuse 16 are formed over a buried (or back) oxide layer (BOX) 40 and underlying silicon substrate 42 as would be encountered in, for example, a SOI structure. In such a structure, the silicon substrate 42, sometimes referred to as a handling substrate due to the mechanical robustness it provides, is highly thermally conductive and can function as an efficient heat sink if a thermal path thereto is provided by, for example, polysilicon studs 44 which may be elongated perpendicular to the page of FIG. 3, as shown by dashed lines 46 in FIG. 4. Connections 26' and 36 may be elongated in the same manner to increase area and decrease thermal resistance. While for ease of visualization, the spacing between connection 36 and the fuse element is illustrated as being relatively large, in the invention this spacing is preferably minimized. By providing a crack-stop layer close to the fuse, the chances of a crack penetrating barrier layer 20 is substantially reduced. In addition, providing this element 36 in proximity to the fuse element provides yet another thermal dissipation path, limiting the temperature excursion of the SiLK.

Depending on the ground rules of the technology, this would be implemented as a long bar adjacent to the fuse element with frequent connections (and hence low thermal resistance) contacts to the metal element embedded within the SiLK layer. Connection 26' is desired to be close enough to allow good thermal dissipation, while far enough away that cracks terminate in the layer containing merged connections 36; the least active structure near the fuse. This arrangement thus maintains thermal resistance as low as possible with a three-dimensional structure providing heat dissipation in all directions from the fuse element.

Also shown in FIG. 3 are a barrier layer and an additional SiLK layer, collectively identified by reference numeral 48. These layers, for purposes of the practice of the invention, are arbitrary and may be of any constitution dictated by the particular design of the device, such as SiLK/barrier layers for fabrication of additional metal layers. The overlaying of layers 48 directly on (or above, if additional SiLK thickness is provided, as in FIG. 2) region 32 clearly illustrates the thermal shielding and the stress buffering crack stop effects of the invention.

By the use of heat-sink/crack stop region 32, the volume of SiLK material subjected to thermal degradation is substantially reduced, as are remanent shear and tensile forces. In general, unless clearly excessive currents are used for programming a fuse, the invention is capable of maintaining temperatures below the glass transition temperature of the low-k dielectric and stresses will revert to their original state upon cooling. Further, the volume of SiLK material subjected to large thermal excursion during fuse programming is significantly reduced; thus reducing transient shear and tensile forces due to CTE mismatch. A plan view of the heat shield/crack stop in accordance with the invention is shown in FIG. 4. It can be readily seen that region 32 covers a substantial amount of the fuse area and the coverage is limited only by the provision of a small clearance around the upper extremity 28 of the contact stack 22, 26, 28 (FIG. 1). It should be appreciated that the extent of this coverage does not increase the footprint of the fuse structure except to the extent that additional space is required for thermal path 36.

The overall fuse structure can be scaled to very small sizes and fuses are usually spaced sufficiently from each other or other structures that the required footprint need not be increased (or scaling limited) at all. Further, since thermal paths are usually formed of good electrical conductors and any integral heat sink is usually held at a substantially constant voltage, the region 32 also provides improved electrical shielding and improved noise immunity. Efficiency of the invention to provide crack protection and electrical shielding are increased by proximity to the substrate and implementation at lower layers while plenary protection of upper layers is provided.

Figure 5:
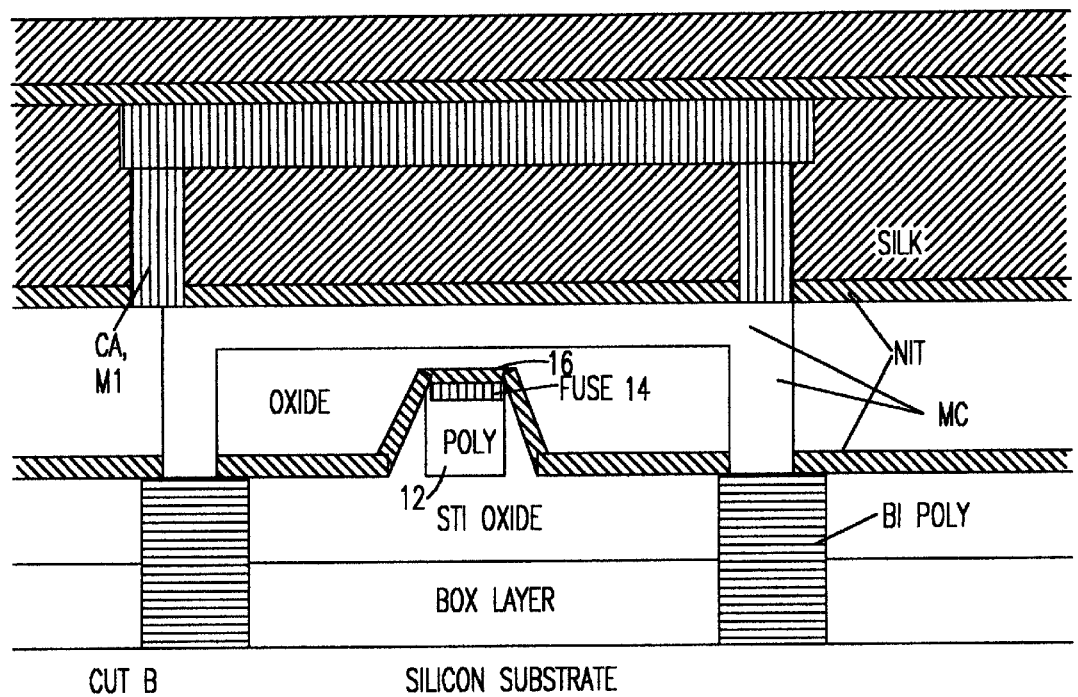
FIGS. 5 and 6 are cross-sectional views of variant forms of the invention, specifically
Figure 6:
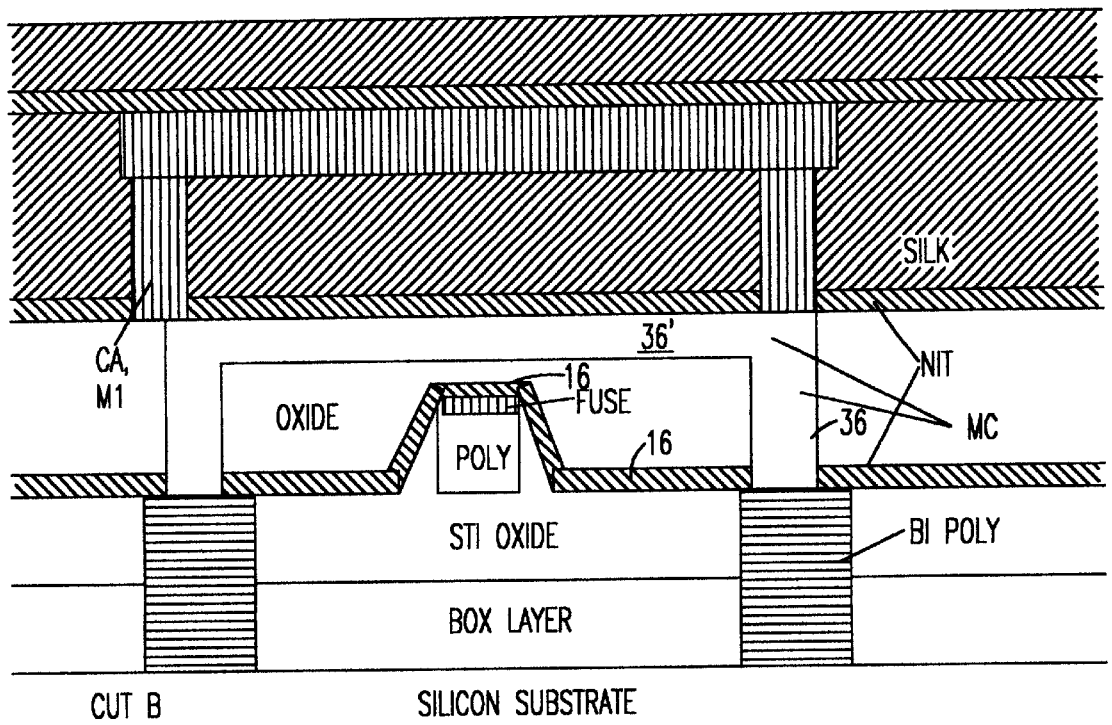

Exemplary variant forms of the invention are illustrated in FIGS. 5 and 6. In FIG. 5, the merged conductor structure 36 also includes a portion 36' of high thermal conductivity material extending over the fuse element and is preferably formed in a damascene manner, reducing the thickness of oxide 18 overlying the fuse element and further reducing thermal resistance. Thus, heat can be even more readily conducted away from the fuse element to CA and M1 structure 26'. Further, as shown in FIG. 6, it is possible to rely on the insulating properties of nitride 16 and to place the extended MC region 36' directly on the nitride 16 overlying the fuse element. This latter embodiment allows the extended MC region 36' to be formed in a simplified manner without using a mask unless simultaneous contacts to the gate are also desired in the same process step. In fact, since the polysilicon fuse element is covered on three sides with nitride 16 and overlies STI oxide 38, the M1 layer may be redundant and may be replaced entirely by thermally conductive material 36'.

From the foregoing, it is seen that the invention can be easily and simply implemented with no or a single, minimal additional process step. The invention provides a structure which avoids or limits cracking as a result of programming of fuses included in integrated circuits or interconnection structures. The invention can be implemented at any metallization layer in any such device and is more efficient at lower levels of metallization where, previously, fuses could only be placed with substantial risk of compromise of manufacturing yield. The invention supports extremely high density integration and close proximity of conductors while maintaining high performance and noise immunity since it overcomes difficulties presented by low thermal conductivity and strength of low-k organic dielectric materials and limits thermal degradation thereof in the proximity of fuses.

The invention further provides for enhanced thermal regulation of electronic devices as well as electrical shielding by providing efficient thermal paths through a multilayer structure and can be used with other heat producing elements as well as fuses. The invention provides these meritorious effects through mechanical, chemical and thermal encapsulation of a low-k dielectric material in the proximity of a heat source.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An electronic device including:
   a fuse,
   a layer of dielectric material overlying said fuse,
   a layer of low-k dielectric material overlying said layer of dielectric material, and
   a layer of thermally conductive material embedded within said low k-dielectric material and interposed between said dielectric material and said low-k dielectric material, and located over said fuse.

2. An electronic device as recited in claim 1, further including a layer of low-k dielectric material interposed between said dielectric layer and said layer of thermally conductive material.

3. An electronic device as recited in claim 1, further including
   means for removing heat from said layer of thermally conductive material.

4. An electronic device as recited in claim 1, further including:
   thermally conductive material extending generally parallel to said fuse, and adjacent said dielectric material and being embedded within said low-k dielectric material.

5. An electronic device as recited in claim 4, further including:
   a second thermally conductive material extending above said fuse to said layer of thermally conductive material, being embedded within said low-k dielectric material and extending parallel to said fuse.

6. An electronic device as recited in claim 4, further including:
   thermal connection material extending below said thermally conductive material, and extending parallel to said face.

7. An electronic device as recited in claim 6, wherein said thermal connection material extends to a heat sink.

8. An electronic device as recited in claim 7, wherein said heat sink includes a semiconductor substrate.

9. An electronic device as recited in claim 5, further including:
   thermal connection material extending below said thermally conductive material, and extending parallel to said fuse.

10. An electronic device as recited in claim 9, wherein said thermal connection material extends to a heat sink.

11. An electronic device as recited in claim 10, wherein said heat sink includes a semiconductor substrate.

12. An electronic device as recited in claim 1, wherein said layer of thermally conductive material is a patterned metal layer.

13. An electronic device as recited in claim 1, wherein said layer of thermally conductive material is formed by a damascene process.

14. An electronic device as recited in claim 5, wherein said layer of thermally conductive material and said second thermally conductive material are formed by a dual damascene process.

15. An electronic device as recited in claim 1, wherein said low-k dielectric material comprises SiLK.

16. An electronic device as recited in claim 1, wherein said layer of thermally conductive material forms a crack-stop structure.

* * * * *